United States Patent [19]

Kenney

[11] Patent Number: 4,939,567
[45] Date of Patent: Jul. 3, 1990

[54] TRENCH INTERCONNECT FOR CMOS DIFFUSION REGIONS

[75] Inventor: Donald M. Kenney, Shelburne, Vt.

[73] Assignee: IBM Corporation, Armonk, N.Y.

[21] Appl. No.: 303,986

[22] Filed: Jan. 30, 1989

Related U.S. Application Data

[63] Continuation of Ser. No. 135,954, Dec. 21, 1987, abandoned.

[51] Int. Cl.$^5$ .................... H01L 27/02; H01L 29/78; H01L 29/04; H01L 23/48
[52] U.S. Cl. ............................. 357/42; 357/23.1; 357/49; 357/54; 357/59; 357/67; 357/71
[58] Field of Search ................. 357/23.1, 42, 49, 55, 357/54, 59, 67, 71

[56] References Cited

U.S. PATENT DOCUMENTS

| | | | |
|---|---|---|---|
| 4,477,310 | 10/1984 | Park et al. | 357/42 |
| 4,503,451 | 3/1985 | Lund et al. | 357/42 |
| 4,613,886 | 9/1986 | Chwang | 357/52 |
| 4,647,957 | 3/1987 | Coquin et al. | 357/42 |
| 4,650,544 | 3/1987 | Erb et al. | 357/51 |
| 4,653,025 | 3/1987 | Minato et al. | 347/42 |
| 4,661,202 | 4/1987 | Ochii | 156/643 |

FOREIGN PATENT DOCUMENTS

| | | | |
|---|---|---|---|
| 0178649 | 7/1986 | European Pat. Off. | 357/42 |
| 60-97661 | 5/1985 | Japan | 357/42 |
| 60-130163 | 7/1985 | Japan | 357/55 |
| 61-46042 | 3/1986 | Japan | 357/42 |
| 61-97858 | 5/1986 | Japan | 357/42 |

OTHER PUBLICATIONS

N. Lu et al., "The SPT Cell-A New Substrate-Plate Trench Cell for DRAMS," ISSCC Digest of Technical Papers-1987.

Primary Examiner—J. Carroll
Attorney, Agent, or Firm—Mark F. Chadurjian

[57] ABSTRACT

A sub-surface interconnection structure for coupling an n-type diffusion to a p-type diffusion. The structure is a conductor-filled trench disposed between the diffusion regions. The trench has a thin dielectric layer on its sidewalls and bottom. The conductor within the trench contacts the diffusion regions. Parasitic device formation between the diffusion regions is suppressed because the trench provides a parasitic gate that is shorted to the parasitic source regions (i.e., the coupled diffusion regions). Moreover, the trench provides an enlarged contact to the coupled diffusion regions for the subsequently-applied metal layer.

5 Claims, 2 Drawing Sheets

TRENCH INTERCONNECT FOR CMOS DIFFUSION REGIONS

This a continuation of copending application Ser. No. 07/135,954 filed on Dec. 21, 1987, now abandoned.

CROSS-REFERENCE TO CO-PENDING APPLICATIONS

Reference is made to co-pending U.S. patent application Ser. No. 920,471, entitled "Silicide Bridge Contact," filed Oct. 20, 1986, by N.C.C. Lu et al. and assigned to the assignee of the present invention. The application relates to forming a bridge contact between a polysilicon-filled trench storage capacitor and an adjacent diffusion region.

TECHNICAL FIELD

The invention relates to a conductor-filled trench that interconnects differentially-doped diffusion regions.

BACKGROUND ART

In complementary metal oxide silicon (CMOS) technology, the gate electrodes of n-channel and p-channel field effect transistors (FET) are interconnected. Thus, for a given applied voltage, one of the two devices will always be off. Such an arrangement provides a great power savings as compared to NMOS (i.e., solely n-channel FET) technology, wherein unnecessary current paths to ground abound.

In some CMOS circuits, it is also necessary to interconnect one of the n-type source/drain diffusion regions to one of the p-type source/drain diffusion regions. An example of such a circuit is the conventional six device static random access memory (SRAM) cell shown in FIG. 1 (Prior Art). In FIG. 1, the p-channel transistors are indicated by the boxes having a line through them and the n-channel transistors are indicated by the empty boxes. N-channel transistors 10 and 12 serve to access the memory cell defined by the four device latch comprised of n-channel devices 14 and 18 and p-channel devices 16 and 20. Of interest is the interconnection at N1 between the n-channel drain diffusion of transistor 14 and the p-channel drain diffusion of transistor 16, as well as the interconnection at N2 between the n-type drain diffusion of transistor 18 and the p-type drain diffusion of transistor 20.

Conventionally, these diffusion interconnections would be accomplished by depositing a layer of metal coupled to the diffusion regions in question through vias formed in a passivation layer. Examples of such interconnections are shown in FIGS. 1 and 2 of U.S. Pat. No. 4,661,202, entitled "Method of Manufacturing Semiconductor Device," issued Apr. 28, 1987, to Ochii and assigned to Toshiba. This patent also shows a trench filled with dielectric material for isolating the n-channel and p-channel devices from one another.

However, this conventional interconnect method presents disadvantages when applied to a circuit such as the SRAM cell of FIG. 1. Here, the circuit must be designed to maximize density. If we use the prior art metal interconnect techniques, the metal layer must provide (a) the interconnect between the diffusion regions at nodes N1 and N2; (b) the interconnect between node N1 and the gates of devices 18 and 20; (c) the interconnect between node N2 and the gates of devices 14 and 16, (d) the metal bit lines; and (e) the supply voltage contacts for VH and VG. It has been found by layout modelling that a metal layer cannot be defined to simultaneously meet all of the above interconnect requirements without substantially degrading the density of the memory cell.

In considering which of these interconnect functions should be borne by another conductive structure, it would be advantageous to use a structure that is on the same topological level as the structures to be interconnected. For example, the CMOS gate electrodes are typically interconnected by the same polysilicon layer that defines the gates. Since the interconnect functions (b)-(e) above necessitate an interconnection between a structure at one topological level to a structure of another topological level, it would be advantageous to meet interconnect requirement (a) utilizing a conductive structure at the same topological level (i.e., beneath the substrate surface) as the diffusion regions. The diffusion regions must be interconnected in a manner that does not affect the latchup prevention normally provided by an intervening isolation structure (see e.g., the Ochii patent cited above). If the diffusion regions are coupled together by simply incorporating a doped silicon region, unacceptable source/drain to substrate or n-well connections result.

Thus, a need has developed in the art for a structure that interconnects n-type diffusion regions and p-type diffusion regions without degrading circuit performance.

SUMMARY OF THE INVENTION

It is thus an object of the present invention to provide a means for interconnecting n-type diffusions and p-type diffusions using a conductive structure at the same topological level as the diffusions.

It is another object of the invention to provide a sub-surface diffusion interconnection means that does not degrade the performance characteristics of the resulting circuit.

It is yet another object of the invention to provide a diffusion interconnect means that maximizes the layout density of a CMOS circuit.

These and other objects of the invention are realized by a sub-surface interconnection means for coupling an n-type diffusion to a p-type diffusion. The interconnection means is comprised of a conductor-filled trench disposed between the diffusion regions. The trench has a thin di-electric layer on its sidewalls and bottom. The conductor within the trench contacts the diffusion regions. Parasitic device formation between the diffusion regions is suppressed because the trench provides a parasitic gate that is shorted to the parasitic source regions (i.e., the coupled diffusion regions). As such, the trench may be more shallow than conventional trench isolation structures. Moreover, the trench provides an enlarged contact area to the coupled diffusion regions for the subsequently-applied metal layer.

BRIEF DESCRIPTION OF THE DRAWING

The above and other structures and teachings of the present invention will become more apparent upon a description of the best mode thereof. In the description to follow, reference will be made to the accompanying Drawing, in which.

DETAILED DESCRIPTION OF THE BEST MODE FOR CARRYING OUT THE INVENTION

Figure 2:
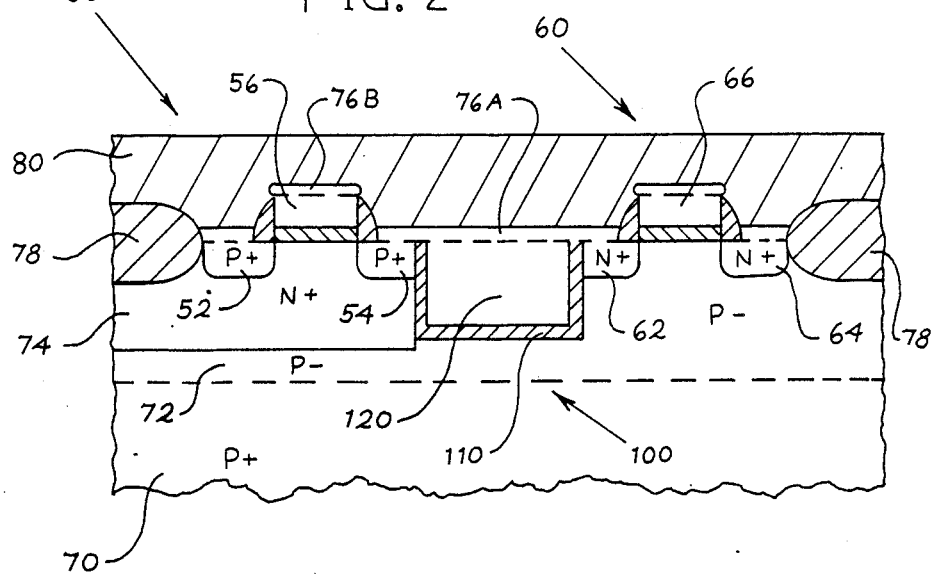
FIG. 2 is a cross-sectional view of a substrate showing the interconnection structure of the invention.

FIG. 2 shows a substrate 70 having a p-channel device 50 and an n-channel device 60 formed thereon. The substrate 70 is <100> oriented, P+ type monocrystalline silicon. A P-type epitaxial silicon layer 72 is grown on the substrate 70, and an N well 74 is defined in a portion of the epitaxial layer 72 by conventional masking and implantation steps. Although a single N well CMOS substrate is shown, the invention could also be practiced on a "twin-tub" (i.e., separate N and P wells) CMOS substrate or a P well CMOS substrate. The p-channel device 50 is formed in the N well 74, and comprises P+ type source/drain diffusion regions 52, 54 and a gate electrode 56 disposed over a portion of the substrate between the diffusion regions 52, 54 so as to control the channel region of the device. Similarly, n-channel transistor 60 comprises N+ type source/drain diffusion regions 62, 64, and a gate electrode 66 that controls the channel region of the device. The gate electrodes 56, 66 of the two transistors are formed from the same conductor material (e.g., doped polysilicon, a refractory metal such as tungsten, a refractory metal silicide such as tungsten silicide, etc.) disposed on respective gate dielectrics. The conductor is continuous between the two electrodes, to thus provide electrical coupling therebetween. A passivating layer 80 (e.g., a doped glass such as borophosphosilicate glass or phosphosilicate glass, or an organic resin such as polyimide) is coated on the substrate, and a layer of metal (not shown) is deposited on the passivation layer to provide contact through vias (not shown) etched through the passivation layer.

Of particular interest is the filled trench 100 disposed between the P+ diffusion region 54 and the N+ diffusion region 62. A conductive layer 120 disposed within the trench electrically couples the diffusion regions 54 and 62 to one another. The conductor 120 (which may be comprised of any of the conductive materials listed above, preferably of P type doped polysilicon) is insulated from the substrate 70 by a thin dielectric structure 110.

Conductive regions provide electrical coupling between the diffusion regions and the poly-filled trench. These conductive regions could be formed by depositing and etching a conductive layer on the surface of the substrate, or by depositing a layer of refractory metal (such as titanium) under conditions promoting columnar grain growth, and sintering to form titanium silicide (as disclosed in the above-mentioned co-pending U.S. patent application Ser. No. 920,471). However, it is preferred to form the conductive regions by exposing the substrate to conditions ($SiCl_2H_2$ plus HCl at 880° C. and 40 Torr) under which epitaxial silicon selectively grows only on the exposed silicon regions and extends laterally to cover the thin dielectric 110 without covering the other dielectric regions, depositing a refractory metal such as titanium (at 390° C.), and sintering to form a silicide that bridges over the dielectric 110 to form a bridge contact 76A while enhancing the conductivity of the gate, source and drain electrodes by providing silicide regions 76B thereon.

The trench has a dielectric structure much thinner than normally used for isolation 110 disposed on its sidewalls. The dielectric structure can be made of silicon oxide, silicon nitride, silicon oxynitride, or combinations thereof. In general, the dielectric is on the order of up to 200 Å in thickness. This is generally much thinner than the dielectric layers normally used to provide isolation. The reasons for this will be explained below. A bilayer structure of silicon oxide (40 Å) and silicon nitride (70 Å) has been found to provide sufficient dielectric properties.

A conductor-filled trench has been used in dynamic random access memory (DRAM) applications, wherein the conductor is electrically coupled to a diffusion region of the access transistor to provide a storage capacitor structure. See Lu et al., "The SPT Cell—A New Substrate-Plate Trench Cell For DRAMS," ISSCC Digest of Technical Papers 1987. Moreover, trenches filled with undoped polysilicon having thick dielectric layers (up to 5000 Å) disposed on their sidewalls are known for providing isolation between adjacent n-channel and p-channel devices. See U.S. Pat. No. 4,647,957, entitled "Latchup-Preventing CMOS Device," issued 3/3/87 to Loquin et al. and assigned to AT&T.

As described above, the filled trench of the invention provides a sub-surface coupling between differentially-doped diffusion regions. This eliminates the need to couple the diffusions together by using a layer of metal, thus increasing the density of the resulting integrated circuits.

The filled trench provides enhanced isolation between the n-channel and p-channel transistors. The thin dielectric described above permits the conductive trench fill 120 to act as a control gate for parasitic devices that may form between the n-channel and p-channel devices. For example, the trench fill 120 gates the parasitic device defined by P+ type diffusion 54, N well 74, and the P+ type substrate. Because the trench fill 120 is electrically coupled to source diffusion region 54, and because the P+ substrate is always the parasitic drain at ground potential, the gate-to-source differential is always zero, such that the parasitic FET device will never turn on. Similarly, a second parasitic defined by N well 74, epi 72, and N+ type diffusion region 62 is gated by the conductive fill 120 coupled to diffusion region 62, such that its gate-to-source is zero and because the N-well is always the parasitic drain at +Vh potential, and it cannot turn on. In other words, the filled trench provides a gate-to-source coupling that prohibits parasitic formation about its sidewalls. In practice, the depth of the trench is not critical. It can be as deep as the diffusion, or it can extend to the bottom of the n-well to provide an additional p-n boundary.

Figure 1:
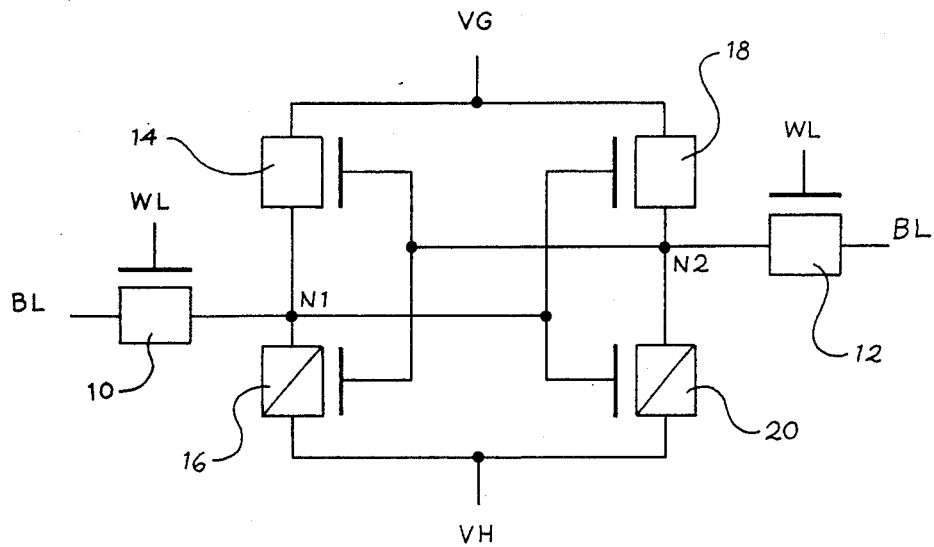
FIG. 1 (Prior Art) is a schematic diagram of a conventional six-device SRAM cell.
Figure 3:
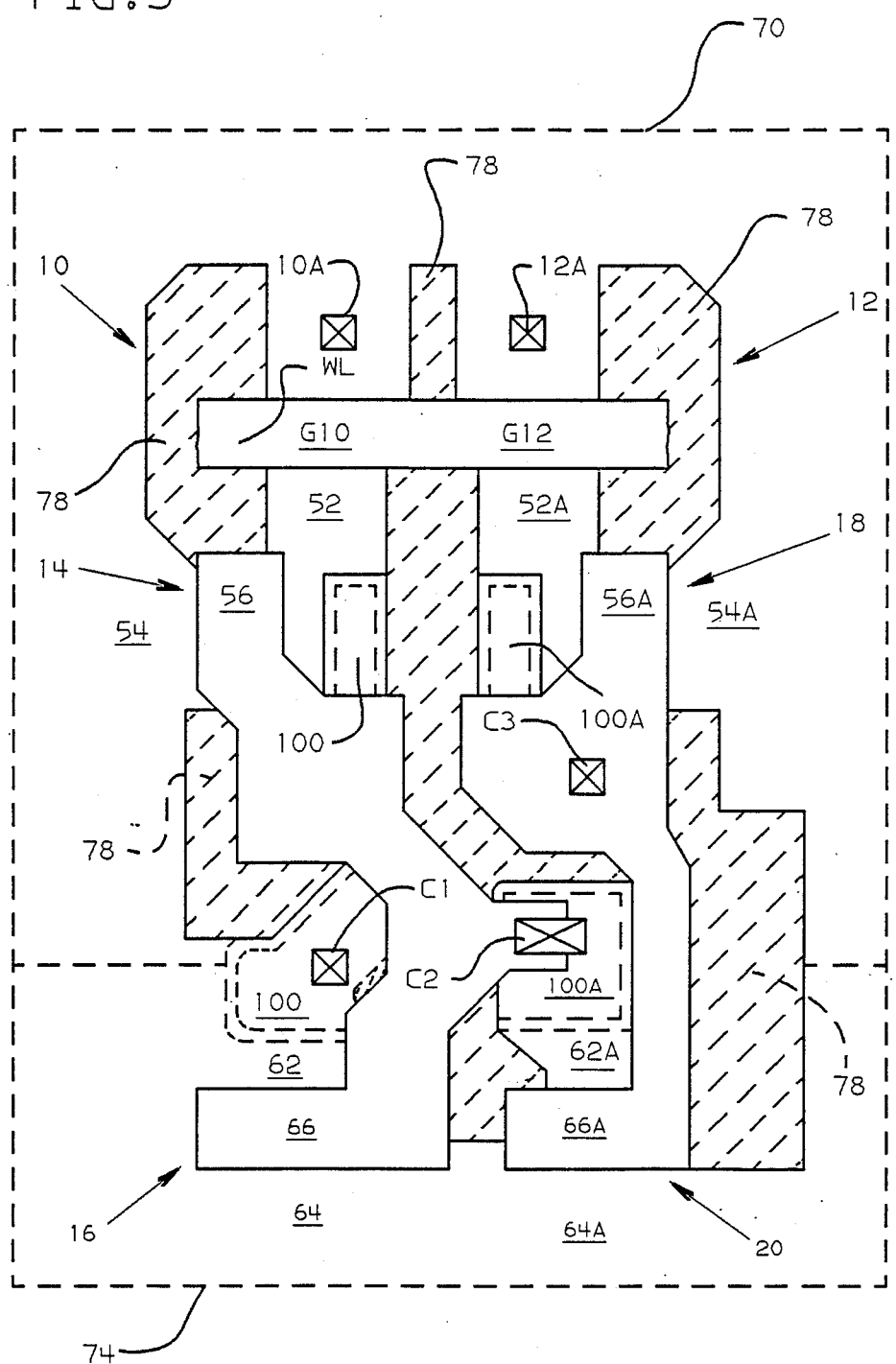
FIG. 3 is a top view of a six-device SRAM cell layout utilizing the interconnection structure of the invention.

FIG. 3 shows a top view of a layout for a six device SRAM cell as shown schematically in FIG. 1, using the sub-surface trench connection of the invention. In FIG. 3, reference numerals repeated from FIGS. 1–2 indicate the same structural features. Thus, the gates of transistors 10 and 12 of FIG. 1 are defined by the polysilicon portions G10, G12 of polysilicon line WL, the drain regions thereof are defined by the portion of the substrate 70 contacted by BL contacts 10A and 12A, and the source regions thereof are defined by the portion of the substrate below the polysilicon line WL. These latter substrate portions also define diffused electrodes 52, 52A of n-type devices 14 and 18. The gate electrodes of devices 14 and 18 are defined by polysilicon portions 56, 56A, respectively. The other diffused electrodes of devices 14 and 18 are defined by substrate portions 54, 54A on the other side of polysilicon portions 56, 56A, respectively. Finally, devices 16 and 20 are defined by diffusion regions 62, 62A, and 64, 64A formed within N+ well region 74, with intervening polysilicon portions 66, 66A providing the gate electrodes, respectively. Isolation is provided by regions 78.

The gates 56, 66 and 56A, 66A of transistors 14, 16, and 18, 20, respectively, are provided by the same polysilicon line and thus are interconnected. The polysilicon line defining the gates of transistors 14, 16 is coupled to the diffused electrode 62A of device 20 by a contact $C_2$ which is covered by a metal segment (not shown). The polysilicon line defining the gates of transistors 18, 20 is coupled to the diffusion regions 62 of transistor 16 by a metal line (not shown) that couples the contacts $C_1$ and $C_3$ together. Other metal lines and contacts (not shown) provide the ground and VH contacts. Of particular interest are the poly-filled trenches 100, 100A that couple nodes N1 and N2 (i.e., diffused electrodes 52, 52A of transistors 14, 18) to diffused electrodes 62, 62A of devices 16, 20, respectively. If this coupling was provided by the overlaying metal layer, the layout would have to be expanded to accommodate contacts for regions 52 and 52A. Moreover, additional space would be required to provide coupling metal lines that would not interfere with the $C_2$–$C_3$ coupling.

The layout shown in FIG. 3 illustrates another advantage of the invention. Normally, in forming a metal contact, the alignment to the underlying diffused electrode is critical. For example, in forming contact $C_1$, a critical alignment would normally be maintained with respect to the edge of the N+ well 74 as well as to the adjacent polysilicon lines and isolation regions. However, because of the poly-filled trench 100 coupled to region 62, alignment to these structures is no longer critical because the trench presents an enlarged area to contact. As shown in FIG. 3, the contact $C_1$ can now be formed beyond the edge of the N well 74. By minimizing these critical alignment constraints, the possibility of misalignment decreases, to thus increase the manufacturing yield of wafers processed to provide the structures of the invention.

It is to be understood that various modifications may be made to the structures described above without departing from the spirit and scope of the invention. For example, while the invention has been described with reference to a six-device memory cell, it should be understood that the invention is applicable to any logic or memory circuit in which the diffused electrodes of n-channel and p-channel devices are to be interconnected.

I claim:

1. In a semiconductor circuit formed on a substrate of a first conductivity type having a well region therein of a second conductivity type, a structure for coupling a first diffusion region of a second conductivity type formed in the substrate to a second diffusion region of said first conductivity type formed within said well region, comprising a trench having sidewalls and a bottom, said trench being filled with a material of substantially uniform conductivity and having a dielectric structure of a thickness less than approximately 200 Å disposed on said sidewalls and bottom thereof, said trench providing a sub-surface electrical contact to both of said first and second diffusion regions and establishing a gate-to-source parasitic coupling that prevents parasitic device formation.

2. The structure as recited in claim 1, wherein said conductive material is selected from the group consisting of doped polysilicon, refractory metals, refractory metal silicides, and combinations thereof.

3. The structure recited in claim 1, wherein said dielectric structure comprises a material selected from the group consisting of silicon oxide, silicon nitride, and silicon oxynitride.

4. The structure as recited in claim 1, wherein said dielectric structure comprises a first layer of silicon oxide formed on said sidewalls and bottom of said trench, and a second layer of silicon nitride atop said first layer of silicon oxide.

5. In an integrated circuit comprising at least one p-channel device and at least one n-channel device formed on a substrate, each of said devices having source and drain diffused electrodes, a sub-surface conductive structure disposed between and providing a sub-surface electrical contact to one of the source and drain electrodes of said p-channel device and to one of said source and drain electrodes of said n-channel device, comprising a substantially uniformly doped poly-filled trench having sidewalls and a bottom, covered by a dielectric structure having a thickness less than approximately 200 Å, said trench establishing a gate-to-source parasitic coupling that prevents parasitic device formation.

* * * * *